(12) United States Patent
Gabor et al.

(10) Patent No.: US 8,158,334 B2
(45) Date of Patent: Apr. 17, 2012

(54) METHODS FOR FORMING A COMPOSITE PATTERN INCLUDING PRINTED RESOLUTION ASSIST FEATURES

(75) Inventors: Allen H. Gabor, Katonah, NY (US); Scott D. Halle, Hopewell Junction, NY (US); Helen Wang, LaGrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 633 days.

(21) Appl. No.: 12/013,627

(22) Filed: Jan. 14, 2008

(65) Prior Publication Data

US 2009/0181330 A1 Jul. 16, 2009

(51) Int. Cl.
*G03F 7/26* (2006.01)
(52) U.S. Cl. .................. 430/314; 430/317; 430/394
(58) Field of Classification Search .................. 430/313, 430/314, 323, 322, 394
See application file for complete search history.

(56) References Cited

U.S. PATENT DOCUMENTS

| | | | |
|---|---|---|---|
| 5,549,934 A | 8/1996 | Garza et al. | |
| 6,147,009 A | 11/2000 | Grill et al. | |
| 6,312,793 B1 | 11/2001 | Grill et al. | |
| 6,316,167 B1 | 11/2001 | Angelopoulos et al. | |
| 6,437,443 B1 | 8/2002 | Grill et al. | |
| 6,441,491 B1 | 8/2002 | Grill et al. | |
| 6,479,110 B2 | 11/2002 | Grill et al. | |
| 6,497,963 B1 | 12/2002 | Grill et al. | |
| 6,541,398 B2 | 4/2003 | Grill et al. | |
| 6,656,667 B2 * | 12/2003 | Huang et al. | 430/322 |
| 6,998,198 B2 * | 2/2006 | Lin et al. | 430/5 |
| 2006/0231524 A1 * | 10/2006 | Liu et al. | 216/41 |
| 2009/0148796 A1 * | 6/2009 | Van Der Heijden et al. | 430/323 |

OTHER PUBLICATIONS

J. E. Meiring et al., "ACLV Driven Double-Patterning Decomposition With Extensively Added Printing Assist Features (PrAFs)", Optical Microlithography XX, Proceedings of SPIE, vol. 6520, 65201U, pp. 1-12, (2007).
D.C. Owe-Yang et al., "Double exposure for the contact layer of the 65-nm node", Advances in Resist Tchnology and Processing XXII, Proceedings of SPIE vol. 5753, pp. 171-181, (2003).
Application filed on Apr. 10, 2007, titled "Multiple Exposure Lithography Method Incorporating Intermediate Layer Patterning".

* cited by examiner

*Primary Examiner* — Kathleen Duda
*Assistant Examiner* — Caleen Sullivan
(74) *Attorney, Agent, or Firm* — Scully, Scott, Murphy & Presser, P.C.; Wenjie Li, Esq.

(57) ABSTRACT

An underlayer to be patterned with a composite pattern is formed on a substrate. The composite pattern is decomposed into a first pattern and a second pattern, each having reduced complexity than the composite pattern. A hard mask layer is formed directly on the underlying layer. A first photoresist is applied over the hard mask layer and lithographically patterned with the first pattern, which is transferred into the hard mask layer by a first etch. A second photoresist is applied over the hard mask layer. The second photoresist is patterned with the second pattern to expose portions of the underlying layer. The exposed portions of the underlying layer are etched employing the second photoresist and the hard mask layer, which contains the first pattern so that the composite pattern is transferred into the underlying layer.

20 Claims, 17 Drawing Sheets

METHODS FOR FORMING A COMPOSITE PATTERN INCLUDING PRINTED RESOLUTION ASSIST FEATURES

FIELD OF THE INVENTION

The present invention relates to semiconductor processing methods, and particularly to methods for forming a composite lithographic pattern of two lithographic patterns employing clear printed resolution assist features (cPRAF) and a hard mask layer.

BACKGROUND OF THE INVENTION

As the minimum pitch required to be resolved has decreased more aggressive off-axis illuminations have been required. These aggressive illuminations allow the minimum pitch to be resolved but have also decreased the depth of focus of larger pitches (typically pitches 1.5 times the minimum pitch). One of the methods employed to improve printability and image fidelity of features with pitches greater than minimum is use of printed resolution assist feature (PRAF), which has dimensions greater or equal to that of the minimum feature size. The difference between a PRAF and a sub-resolution assist feature (SRAF) is that the dimensions of the PRAF are large enough that they are resolvable, while the SRAF are not resolvable but do enhance the aerial image of the desired features. As a consequence, the PRAF is printed on a photoresist, while the SRAF is not printed on a photoresist despite the fact that both are present on a lithographic mask.

Double exposure lithography, in which a first photoresist is applied and patterned followed by application and patterning of a second photoresist, provides a method of patterning a complex pattern with enhanced resolution. Meiring et al., "ACLV driven double-patterning decomposition with extensively added printing assist features (PrAFs)," Proc. SPIE Int. Soc. Opt. Eng. 6520, 65201U (2007) discloses a double exposure scheme, in which PRAFs are employed in the first exposure and then removed in the second exposure. This can be very important in modern circuit designs where decreasing the area that any give function takes up can allow for more functionality to be placed within a given chips area. These PRAFs to date have been lines. In other words, extra lines are added to a design pattern so that the resulting pattern is more like a grating of lines. Because the pattern is more regular in nature the aerial image has more contrast than the pattern where PRAFs have not been added. Because these added lines are not desirable in the final pattern on wafer a second exposure is done which removes the PRAFs.

This combination of double exposure and PRAFs has allowed for even more aggressive illumination to be used (conventional to annular to quasar to custom diffractive optical elements) which has resulted in tighter minimum pitches being resolved. However, many solutions that have been developed for enhancing the process window of layers such and contract holes or metal lines (which require resist holes and/or trenches) with clear PRAFs have drawbacks, Dah-Chung Owe-Yang et al., "Double exposure for the contact layer of the 65-nm node", Proc. SPIE Int. Soc. Opt, Eng. 5753, 171 (2005) discloses alcohol based photoresist to be used for the second exposure to prevent intermixing of the second photoresist with the first photoresist remaining after the first exposure. These alcohol based photoresist are highly undesirable in a manufacturing facility. Alternatively, extra features may be physically present on the wafer, which is present only for supporting the printing of the design. This can usually not be done since the extra features interfere with the functionality of the chip.

In other words, the known methods described above for adding holes or trenches to a pattern to make the pattern more grating like and enhance the aerial image of the design features either are not desirable from a manufacturing perspective or do not eliminate the cPRAF. U.S. patent application Ser. No. 11/733,412 describes a manufacturable method that employs a trilayer photoresist system or a bilayer photoresist system for the first and second exposures, respectively. The bilayer photoresist fills the holes or trenches of the unwanted features printed in the first exposure. Therefore, a conventional organic-based single layer photoresist or an inorganic hardmask may not be employed according to this method.

In view of the above, there exists a need for a method of forming a lithographic pattern containing cPRAF features while employing conventional organic-based single layer resists.

Further, there exists a need for a method of forming a lithographic pattern containing cPRAF features while employing a common hardmasks used in the semiconductor industry.

SUMMARY OF THE INVENTION

The present invention addresses the needs described above by providing methods of forming a composite pattern of two lithographic patterns employing clear printed resolution assist features (cPRAFs) and a hard mask layer.

In the present invention, an underlayer to be patterned with a composite pattern is formed on a substrate. The composite pattern is decomposed into a first pattern and a second pattern. A hard mask layer is formed directly on the underlying layer. A first photoresist is applied over the hard mask layer and lithographically patterned with the first pattern, which is transferred into the hard mask layer by a first etch. A second photoresist is applied over the hard mask layer. The second photoresist is patterned with the second pattern to expose portions of the underlying layer. The exposed portions of the underlying layer are etched employing the second photoresist and the hard mask layer, which contains the first pattern so that the composite pattern is transferred into the underlying layer.

According to an aspect of the present invention, a method of forming a lithographic pattern is provided, which comprises:

forming an underlayer on a substrate;

forming a hard mask layer directly on the underlayer;

applying a first photoresist and lithographically patterning the first photoresist with a first pattern including a first sub-pattern and a second sub-pattern, wherein the first sub-pattern and the second sub-pattern are mutually exclusive of each other and each of the first sub-pattern and the second sub-pattern contains at least one instance of a unit pattern;

transferring the first pattern into the hard mask layer;

applying a second photoresist on the hard mask layer and the underlayer and lithographically patterning the second photoresist with a second pattern, wherein the second pattern overlies the second sub-pattern and does not overlie the first sub-pattern; and transferring a composite pattern of the first pattern and the second pattern into the underlayer, wherein the composite pattern includes the first sub-pattern and excludes the second sub-pattern.

In one embodiment, printability of the first-pattern is greater than printability of the first sub-pattern. For example, the printability of the first pattern may be greater than the printability if the first-sub pattern by containing a more periodic structure than the first sub-pattern. Such improvement in the printability may be achieved when instances of the unit pattern is replicated to forms a regular periodic array in the first pattern, while the first sub-pattern and the second sub-pattern are not as periodic as the first pattern due to lack of some instances of the unit pattern, although each of the first sub-pattern and the second sub-pattern contain some instances of the unit pattern.

In another embodiment, in the first pattern comprises a two dimensional array of the unit pattern. The first pattern may comprise at least one two-dimensional periodic array of the unit pattern.

In even another embodiment, the unit pattern is a contact hole.

In yet another embodiment, the hard mask layer comprises an inorganic material.

In still another embodiment, the method further comprises performing a first anisotropic etch to transfer the first pattern into the hard mask layer, and wherein the first anisotropic etch is selective to the underlayer.

In still yet another embodiment the method further comprises performing a second anisotropic etch to transfer the composite pattern into the underlayer, wherein the second anisotropic etch is selective to the hard mask layer.

According to another aspect of the present invention, another method of forming a lithographic pattern is provided, which comprises:

forming an underlayer on a substrate;
forming a hard mask layer directly on the underlayer;
applying a first photoresist and lithographically patterning the first photoresist with a first pattern including a first sub-pattern and a second sub-pattern, wherein the first pattern includes an array of a unit pattern comprising a subset of the first sub-pattern and the second sub-pattern;
transferring the first pattern into the hard mask layer;
applying a second photoresist on the hard mask layer and the underlayer
and lithographically patterning the second photoresist with a second pattern, wherein the second pattern overlies the second sub-pattern and does not overlie the first sub-pattern; and
transferring a composite pattern of the first pattern and the second pattern into the underlayer, wherein the composite pattern includes the first sub-pattern and excludes the second sub-pattern.

In one embodiment, printability of the first-pattern is greater than printability of the first sub-pattern. For example, the printability of the first pattern may be greater than the printability if the first-sub pattern by containing a more periodic structure than the first sub-pattern. Such improvement in the printability may be achieved when instances of the unit pattern is present in the first pattern, while the first sub-pattern and the second sub-pattern do not contain any instance of the unit pattern.

In another embodiment, each of the first sub-pattern comprises a first trough segment and the second sub-pattern comprises a second trough segment, wherein the second trough segment abuts the first trough segment, and wherein the unit pattern is a trough comprising the first trough segment and the second trough segment.

In even another embodiment, the first pattern comprises a one dimensional array of the trough. The first pattern may comprise a set of nested troughs and the unit pattern is one of the nested troughs.

In yet another embodiment, the method further comprises patterning the underlayer prior to the forming of the hard mask layer.

In still another embodiment, the hard mask layer comprises an inorganic material.

In still yet another embodiment, the method further comprises performing a first anisotropic etch to transfer the first pattern into the hard mask layer, and wherein the first anisotropic etch is selective to the underlayer.

In a further embodiment, the method further comprises performing a second anisotropic etch to transfer the composite pattern into the underlayer, wherein the second anisotropic etch is selective to the hard mask layer.

According to yet another aspect of the present invention, yet another method of forming a lithographic pattern is provided, which comprises:

forming an underlayer on a substrate;
forming a hard mask layer comprising an inorganic material directly on the underlayer;
applying a first photoresist and lithographically patterning the first photoresist with a first pattern including an array of a unit pattern, wherein exposure conditions are optimized for presence of the array of the unit pattern;
transferring the first pattern into the hard mask layer;
applying a second photoresist on the hard mask layer and the underlayer
and lithographically patterning the second photoresist with a second pattern; and
transferring a composite pattern of the first pattern and the second pattern into the underlayer, wherein the composite pattern is a pattern obtained from the first pattern by removing portions of the array within the second pattern.

In one embodiment, the hard mask layer comprises one of a dielectric oxide, a dielectric nitride, a dielectric oxynitride, a tunable etch resistant anti-reflective-coating (TERA) material, amorphous carbon, hydrogenated amorphous carbon, near frictionless carbon (NFC), and a combination thereof.

In another embodiment, the method further comprises applying a planarizing material layer directly on the hard mask layer, wherein the second photoresist is applied on the planarizing material layer.

In yet another embodiment, the second photoresist is applied directly on said hard mask layer.

In still another embodiment, the hard mask layer comprises one of a dielectric oxide, a dielectric nitride, a dielectric oxynitride, amorphous carbon, hydrogenated amorphous carbon, near frictionless carbon (NFC), and a combination thereof.

In yet another embodiment, the hard mask layer comprises a tunable etch resistant anti-reflective-coating (TERA) material.

In still yet another embodiment, the planarizing material layer comprises an inorganic material.

In a further embodiment, the planarizing material layer comprises a spin-on glass (SOG), hydrogen silsesquioxane (HSQ), or near frictionless carbon (NFC).

In a yet further embodiment, the planarizing material layer comprises an anti-reflective-coating (ARC) material or an organic polymer.

BRIEF DESCRIPTION OF THE DRAWINGS

FIG. 10A corresponds to a processing step prior to the step of FIG. 1. FIGS. 10B-10D corresponds to processing steps of FIGS. 2, 6, and 7, respectively.

DETAILED DESCRIPTION OF THE INVENTION

Figure 1:
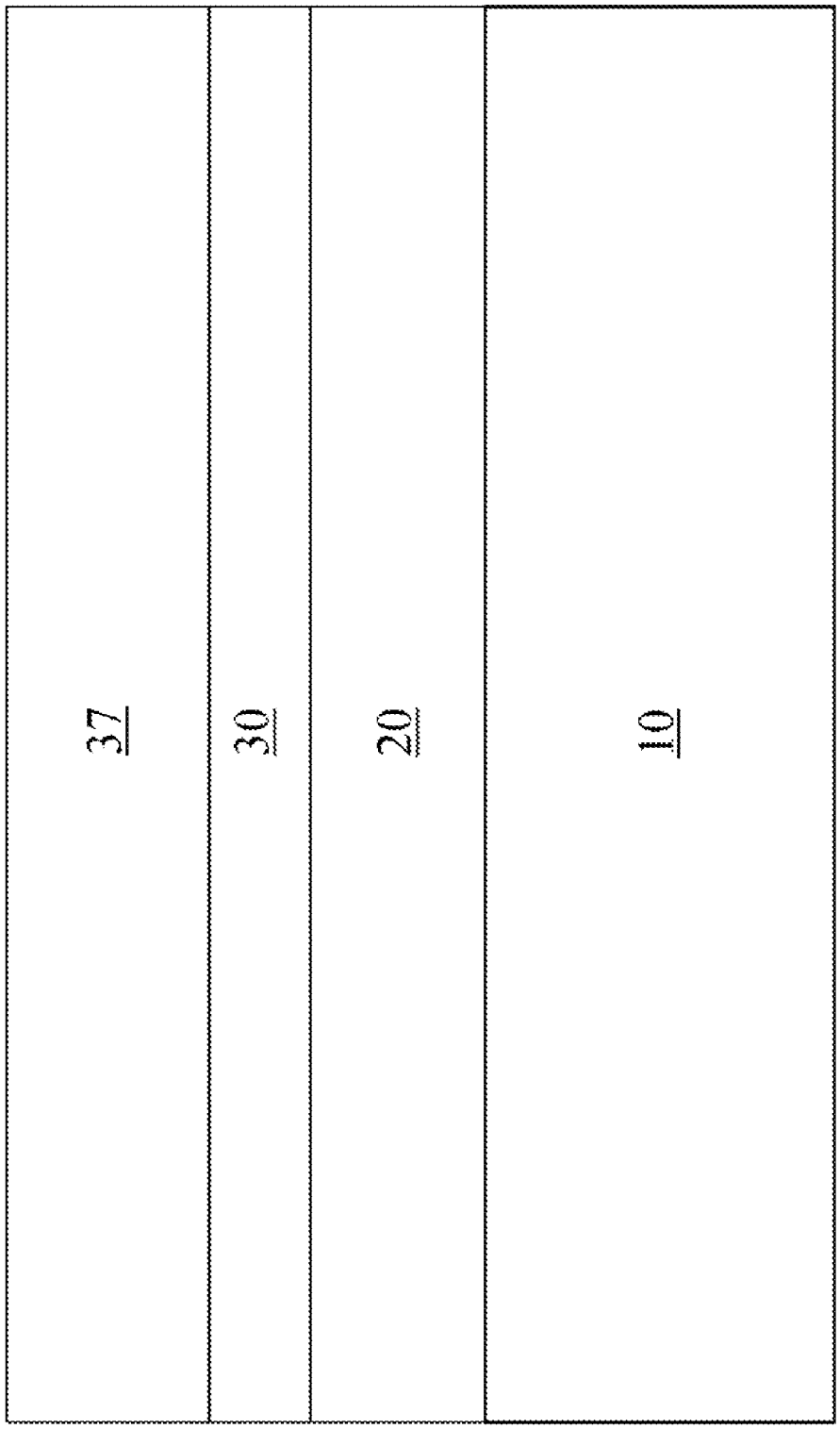
FIGS. 1-7 are sequential vertical cross-sections of a first exemplary lithographic structure according to the present invention.

As stated above, the present invention relates to methods for forming a composite lithographic pattern of two lithographic patterns employing clear printed resolution assist features (cPRAFs) and a hard mask layer, which are now described in detail with accompanying figures. It is noted that like and corresponding elements are referred to by like reference numerals.

In the present invention, methods for forming a composite lithographic pattern of a first and second pattern is provided, wherein the first pattern has a first sub-pattern that contains the features that need to be created based on the design and a second sub-pattern of clear printed resolution assist features (cPRAFs). In this invention, the printability of the first sub-pattern is enhanced by the co-patterning with the second sub-pattern (cPRAFs). The printability here refers to quality of the aerial image contrast, or the profile gradient of a feature edge, which can be determined by a number of standard methods, including the normalized image log slope.

Referring to FIG. 1, a first exemplary lithographic structure according to the present invention comprises a substrate 10, an underlayer 20, a hard mask layer 30, and a first photoresist 37. The substrate 10 may comprise a semiconductor material, a metal, an insulator material, or a stack of multiple layers containing different materials. For example, the substrate 10 may comprise a bulk semiconductor substrate, a semiconductor-on-insulator substrate, a compound semiconductor substrate, a silicon oxide substrate, an aluminum oxide substrate, or a metal substrate. The substrate 10 may, or may not, comprise at least one patterned structure (not shown). For example, the substrate 10 may comprise at least one semiconductor device (not shown) and/or at least one level of metal interconnect structure (not shown).

The underlying layer 20 may comprise a semiconductor material, an insulator material, or a metal. The underlying layer 20 may be a blanket layer without a pattern, or may have a pre-existing pattern. The underlying layer 20 may be integrally formed with the substrate 10, i.e., the underlying layer 20 and the substrate 10 may comprise the same material and may be in one piece, in case the substrate 10 is a semiconductor substrate, the underlying layer 20 may be formed during a front-end-of-line (FEOL) processing step or a back-end-of-line (BEOL) processing step. The thickness of the underlying layer 20 may be from about 3 nm to about 300 nm, and typically from about 10 nm to about 100 nm, although lesser and greater thicknesses are explicitly contemplated herein also.

Non-limiting examples of semiconductor materials that may be employed as the underlying layer 20 include, but are not limited to, amorphous silicon, polysilicon, single crystalline silicon, an amorphous silicon containing alloy, a polycrystalline silicon alloy, a single crystalline silicon alloy, van amorphous compound semiconductor, a polycrystalline compound semiconductor, and a single crystalline compound semiconductor. The semiconductor material of the underlying layer 20 may be undoped or doped with electrical dopants.

In case the underlying layer 20 comprises an insulator material, the underlying layer 20 may comprise an inorganic material including a dielectric oxide such as silicon oxide or a dielectric metal oxide, a dielectric nitride such as silicon nitride or a dielectric metal nitride, or a mixture or a compound thereof.

Alternately, the underlying layer 20 may comprise an organic material such as a thermosetting polyarylene ether and an organosilicate glass (OSG). An example of a thermosetting polyarylene ether is a spin-on low-k dielectric material having a dielectric constant less than 2.8 and commonly referred to as "Silicon Low-K", or "SiLK™." The term "polyarylene" is used herein to denote aryl moieties or inertly substituted aryl moieties which are linked together by bonds, fused rings, or inert linking groups such as oxygen, sulfur, sulfone, sulfoxide, carbonyl, etc. The organosilicate glass (OSG) comprises atoms of Si, C, O, and H, and is also referred to as a SiCOH dielectric material. The OSG is formed by providing at least a first precursor (liquid, gas or vapor) comprising Si, C, O, B, and an inert carrier such as He or Ar, into a reactor such as a plasma enhanced chemical vapor deposition (PECVD) reactor, and then depositing a film derived from the first precursor onto the substrate 10. Methods for forming an layer of an OSG material are disclosed in co-assigned U.S. Pat. Nos. 6,147,009; 6,312,793; 6,441,491; 6,437,443, 6,441,491; 6,541,398; 6,479,110, and 6,497,963, the contents of which are incorporated herein by reference.

The hard mask layer 30 comprises a material that is not soluble in solvents employed in conventional photoresist materials. The hard mask layer 30 comprises a different material from the underlying layer 20. The hard mask layer 30 may comprise an organic material or an inorganic material.

In case the hard mask layer 30 comprises an inorganic material, the hard mask layer 30 may comprise one of a dielectric oxide, a dielectric nitride, a dielectric oxynitride, and amorphous carbon, hydrogenated amorphous carbon, near frictionless carbon (NFC), or a combination thereof. Exemplary dielectric oxides include undoped silicate glass (USG), borosilicate glass (BSG), phosphosilicate glass (PSG), arsenosilicate glass (ASG), borophosphosilicate glass (BPSG), fluorosilicate glass (FSG), and metal oxides that are also known as high dielectric constant oxides including $HfO_2$, $ZrO_2$, $La_2O_3$, $Al_2O_3$, $TiO_2$, $SrTiO_3$, $LaAlO_2$, and $Y_2O_3$. Exemplary dielectric nitrides include silicon nitride and ceramic nitrides such as aluminum nitride, strontium nitride, boron nitride, and beryllium nitride. Examples of dielectric oxynitrides include $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x is independently from about 0.5 to about 3 and each value of y is independently from 0 to about 2. Amorphous carbon and hydrogenated amorphous carbon refer to carbon atoms or hydrogenated carbon atoms that do not have any long range order.

In case the hard mask layer 30 comprise an organic material, the hard mask layer 30 may comprise a tunable etch resistant anti-reflective-coating (TERA) material, which is a material having structural formula R:C:H:X, wherein R is selected from the group consisting of Si, Ge, B, Sn, Fe, Ti and combinations thereof and wherein X is not present or is selected from the group consisting of one or more of O, N, S, and F, and is described in a coassigned U.S. Pat. No. 6,316,167 to Angelopoulos et al., which is incorporated herein by reference.

The first photoresist 37 is a photosensitive material or an electron-beam-sensitive material. In case the first photoresist 37 is a photosensitive material, the first photoresist 37 may be sensitive to a deep ultraviolet (DUV) radiation, a mid-ultraviolet (MUV) radiation, or an extreme ultraviolet (EUV) radiation. The electron-beam-sensitive material may be an electron beam resist which is sensitive to an electron beam radiation. The first photoresist 37 may comprise a single layer of photoresist, or may include a top anti-reflective-coating (TARC) layer and/or a bottom anti-reflective-coating (BARC) layer. The first photoresist 37, including any TARC layer or any BARC layer therein, may be organic or inorganic.

Figure 2:
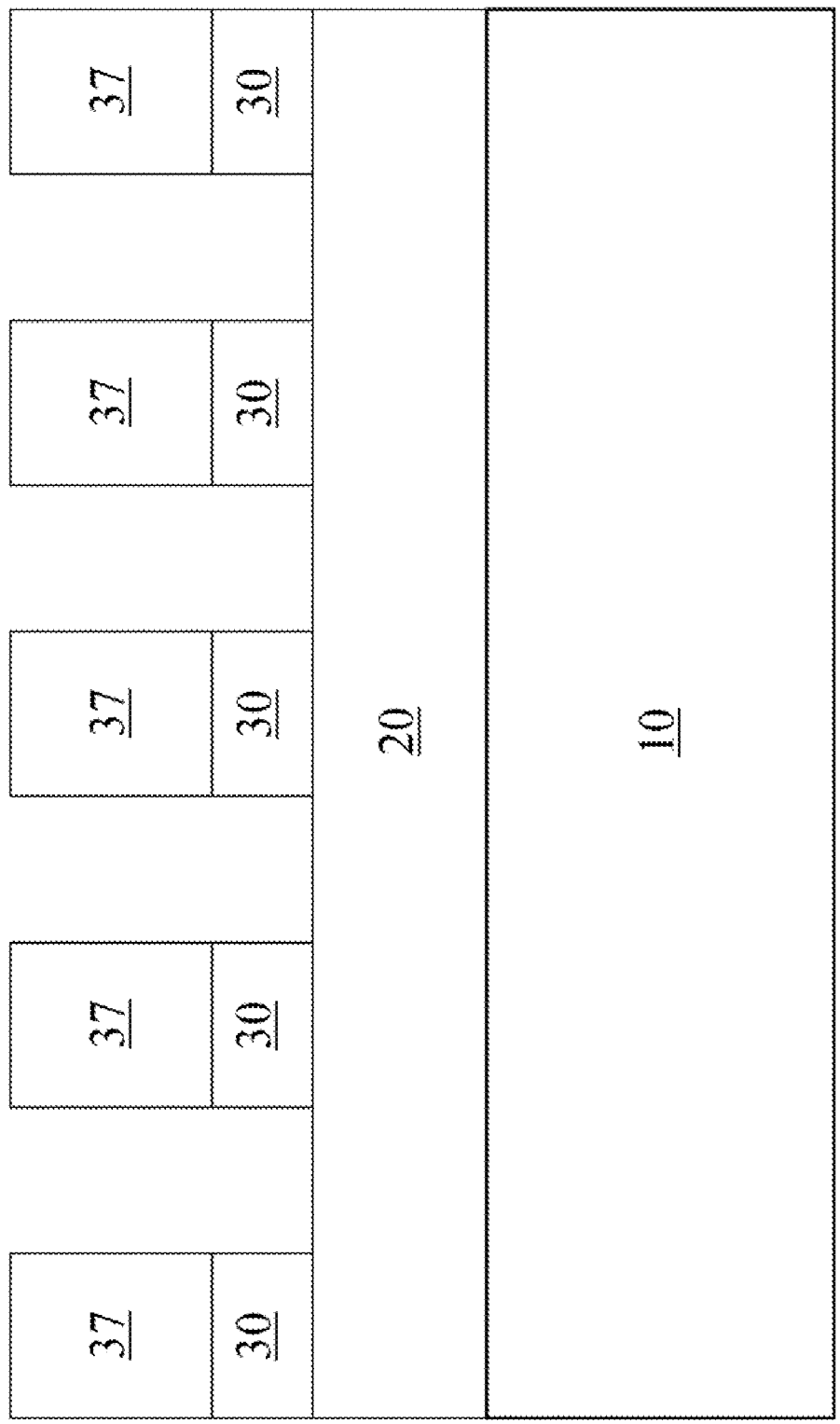

Referring to FIG. 2, a first lithographic pattern is formed in the first photoresist 37 by exposure and development as known in the art. Exposure conditions are optimized depending on the composition and chemical properties of the first photoresist 37 and the type of pattern to be formed in the first photoresist 37. Preferably, the first pattern is a repetitive pattern having a one dimensional periodicity or a two dimensional periodicity. For example, the first pattern may comprise a set of contact holes in a two dimensional array or a set of nested troughs of constant width.

According to the present invention, the first photolithographic pattern includes a pattern having an enhanced periodicity, i.e., a simplified pattern, than a pattern to be subsequently transferred into the underlying layer 20, i.e., a final pattern.

In a first example, a final pattern may include an array of contact holes having a two dimensional periodicity in which a unit cell of the periodicity contains a plurality of contact holes. A simplified pattern may contain additional contact holes to enhance the periodicity so that the unit cell of the array contains one contact hole or a less number of contact holes than the final pattern. The array of contact holes may have a one dimensional periodicity or a two dimensional periodicity. The additional contact holes introduced into the simplified pattern is herein termed "clear printed resolution assist features" (cPRAFs). The clear printed resolution features are present in the simplified pattern but is excluded from the final pattern as described below.

In a second example, the final pattern may include an array of troughs having breaks therebetween. Due to the location of the breaks, the troughs may not form a one dimensional array or form a one dimensional array in which a unit cell includes a plurality of troughs. A simplified pattern may contain parallel troughs without breaks so that the unit cell of the array contains one trough or a less number of troughs than the final pattern. The array of troughs may have a one dimensional periodicity or a two dimensional periodicity. The elimination of the breaks in the troughs, or the filling of the breaks between troughs to form longer contiguous troughs facilitates lithographic printing of the simplified pattern due to enhanced periodicity. The filling portion of the simplified pattern constitutes clear printed resolution assist features (cPRAFs). The clear printed resolution features are present only in the simplified pattern but is excluded from the final pattern.

The exposure conditions during the exposure of the first photoresist 37 are optimized for presence of the array of the unit pattern. Specifically, the enhanced periodicity of the simplified pattern, which is the first pattern, allows tuning of exposure conditions to enhance resolution of features being printed into the first photoresist 37.

The first pattern thus comprises both the final pattern to be subsequently formed in the underlying layer 20 and cPRAFs, which are not subsequently formed in the underlying layer 20. The first pattern, however, has a higher level of periodicity than the final pattern or the cPRAFs. Thus, the first pattern may be a simple array having a one dimensional periodicity or a two dimensional periodicity, while the final pattern is less periodic than the first pattern.

The first lithographic pattern formed in the first photoresist 37 is transferred into the hard mask layer 30 by a first anisotropic etch, which may be an anisotropic reactive ion etch. The exposed portions of the hard mask layer 30 are removed by the first anisotropic etch so that portions of the top surface of the underlying layer 20 are exposed after the first anisotropic etch. Preferably, the first anisotropic etch is selective to the underlying layer 20, i.e., the first anisotropic etch is self-stopping on the underlying layer 20 and any amount of etching into the underlying layer 20 is not substantial. The first photoresist 37 is thereafter removed selective to the hard mask layer 30 and the underlying layer 20, i.e., removal of the hard mask layer 30 and the underlying layer 20 during the stripping of the first photoresist 37 is insignificant.

Figure 3:
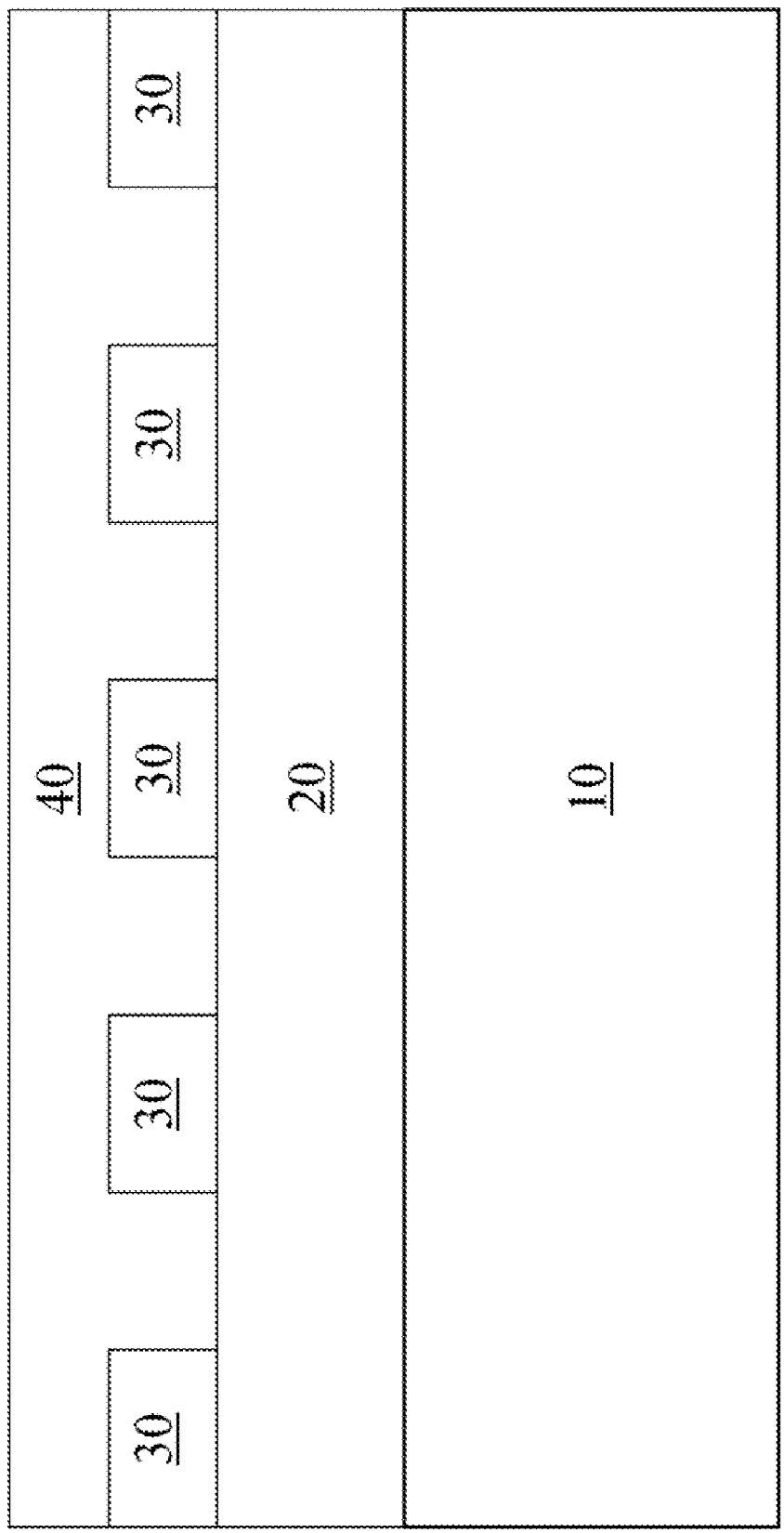

Referring to FIG. 3, an optional planarizing material layer 40 is applied over the hard mask layer 30. The optional planarizing material layer 40 comprises a self-planarizing material. The optional planarizing material layer 40 comprises a different material than the hard mask material and the underlying layer 20. The optional planarizing material layer 40 may be formed by a spin-on coating or other methods of dispensing a self-planarizing material known in the art. The optional planarizing material layer 40 covers top surfaces of the hard mask layer 30, and has a substantially flat top surface.

The optional planarizing material layer 40 may comprise an organic material such as an anti-reflective-coating material or an organic polymer. The anti-reflective-coating material may be of the same type as is employed as a bottom anti-reflective-coating (BARC) layer employed in lithography. The organic polymer may be cross-linked and insoluble to a second photoresist to be subsequently applied. Preferably, the organic polymer etches fast in an oxygen based plasma, but etches slowly in a halogenated plasma. The organic polymer may be the type of material employed as a bottom layer in trilayer lithography.

Alternately, the optional planarizing material layer 40 may comprise an inorganic material such as a spin-on glass (SOG), hydrogen silsesquioxane (HSQ), or near frictionless carbon (NFC). The spin-on glass (SOG) is a spin-coatable oxide, and may be a methyl siloxane-based spin-on glass (SOG). Methods of forming a planarized spin-on glass (SOG) layer are known in the art. Hydrogen silsesquioxane (HSQ) has a general formula of $(H/SiO_{3/2})_n$, and is described in U.S. Pat. No. 5,549,934 to Garza et al. which is incorporated herein by reference.

Figure 4:
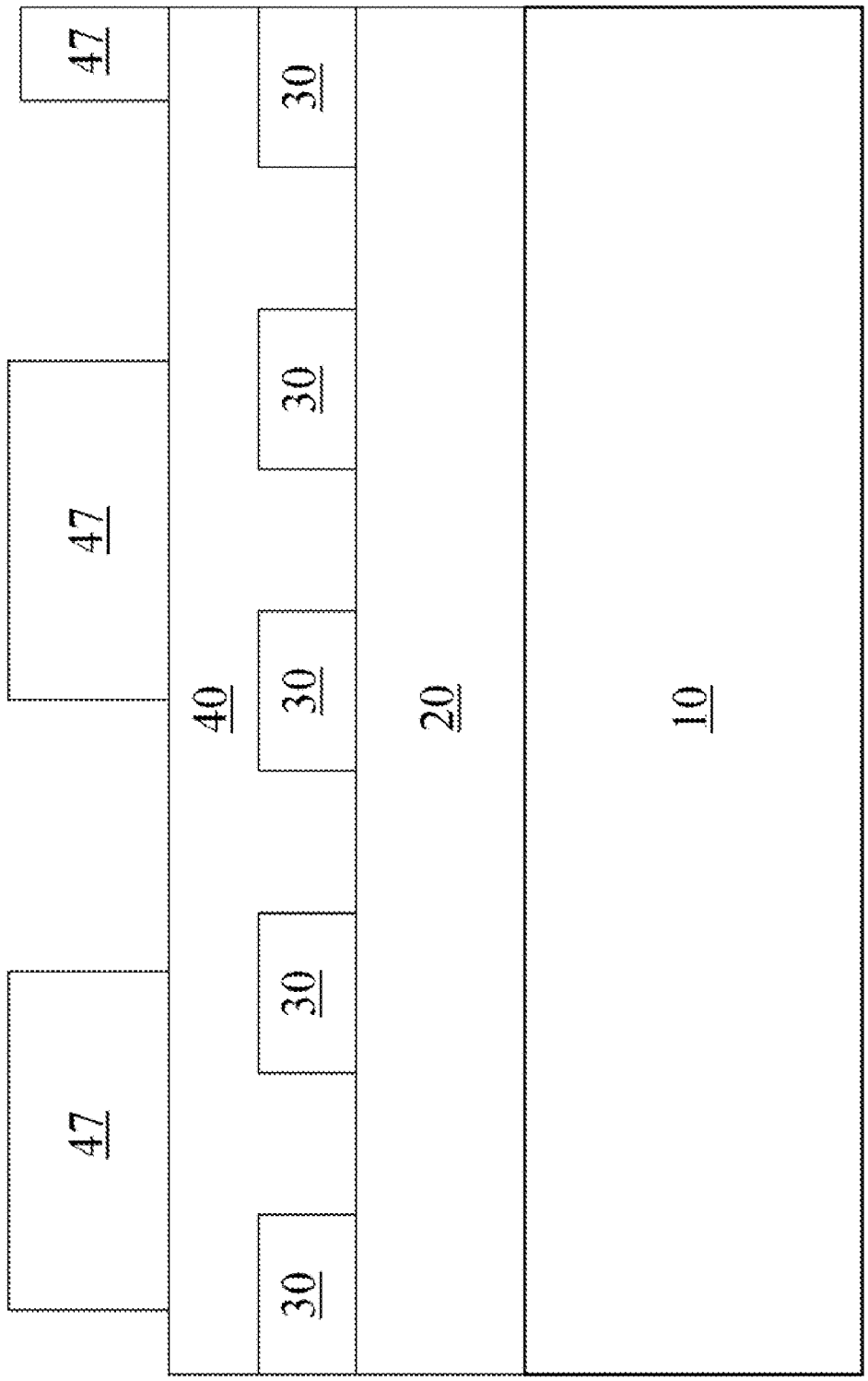

Referring to FIG. 4, a second photoresist 47 is applied to the top surface of the optional planarizing material layer 40, and a second lithographic pattern is formed by exposure and development of the second photoresist 47. The second photoresist 47 is a photosensitive material or an electron-beam-sensitive material. In case the second photoresist 47 is a photosensitive material, the second photoresist may be sensitive to a deep ultraviolet (DUV) radiation, a mid-ultraviolet (MUV) radiation, or an extreme ultraviolet (EUV) radiation. The electron-beam-sensitive material may be an electron beam resist which is sensitive to an electron beam radiation. The second photoresist 47 may comprise a single layer of photoresist, or may include a top anti-reflective-coating (TARC) layer and/or a bottom anti-reflective-coating (BARC) layer. The second photoresist 47, including any TARC layer or any BARC layer therein, is organic. The second photoresist 47 may comprise the same material as, or may comprise a different material from, the first photoresist

37. Use of a bilayer photoresist or a trilayer photoresist is explicitly contemplated herein.

Preferably, the second pattern contains at least one blocking shape that is formed over cPRAFs in the first pattern, while exposing a second subset, which is the complement of the first subset, of features in the first pattern. The cPRAFs in the first pattern and the second subset of features in the first pattern are disjoined from each other, and the union of the first subset and the second subset is the first pattern. The second subset of features constitutes the final pattern to be printed into the underlying layer 20, while the cPRAFs are not printed into the underlying layer 20.

For example, the second pattern may comprise at least blocking shape that is formed over a portion of contact holes if the first pattern comprises an array of contact holes. In another example, the second pattern may comprise at least one blocking shape that is formed over a portion of nested troughs if the first pattern comprises a set of nested troughs.

The hard mask layer 30 is structurally more rigid than any structure that may be formed by a photoresist. Thus, the first lithographic pattern formed in the hard mask layer 30 is structurally more robust than a structure that may be formed in a photoresist. Due to the structural integrity of the first lithographic pattern in the hard mask layer 30, application of the optional planarizing material layer 40 and subsequent application of the second photoresist 47 does not induce collapse of any layer.

Figure 5:
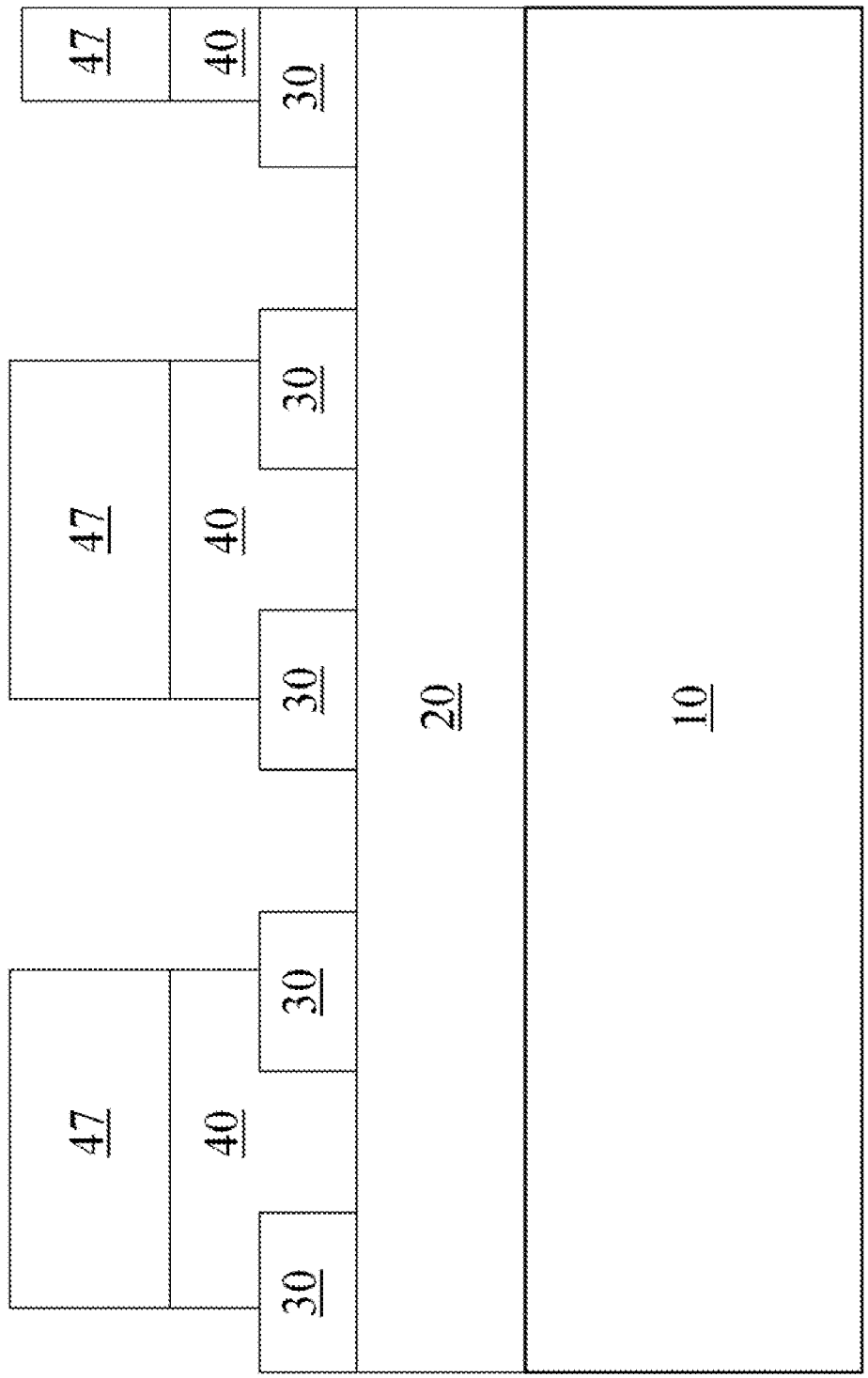

Referring to FIG. 5, the second lithographic pattern formed in the second photoresist 47 is transferred into the optional planarizing material layer 40 by a second anisotropic etch, which may be an anisotropic reactive ion etch. The exposed portions of the optional planarizing material layer 40 are removed by the second anisotropic etch so that portions of the hard mask layer 30 and portions of the top surface of the underlying layer 20 directly underneath openings in the second photoresist 47 are exposed after the second anisotropic etch. Preferably, the second anisotropic etch is selective to the hard mask layer 30, i.e., the second anisotropic etch is self-stopping on the hard mask layer 30. Thus, any amount of etching into the hard mask layer 30 is insubstantial. The pattern of the exposed surfaces of the underlying layer 20 is a composite pattern of the first lithographic pattern of the hard mask layer 30 and the second lithographic pattern of the stack of the optional planarizing material layer 40 and the second photoresist 47. In case the second lithographic pattern contains at least blocking shape, any shape in the first lithographic pattern that overlies the at least one blocking shape is removed from the composite pattern.

Figure 6:
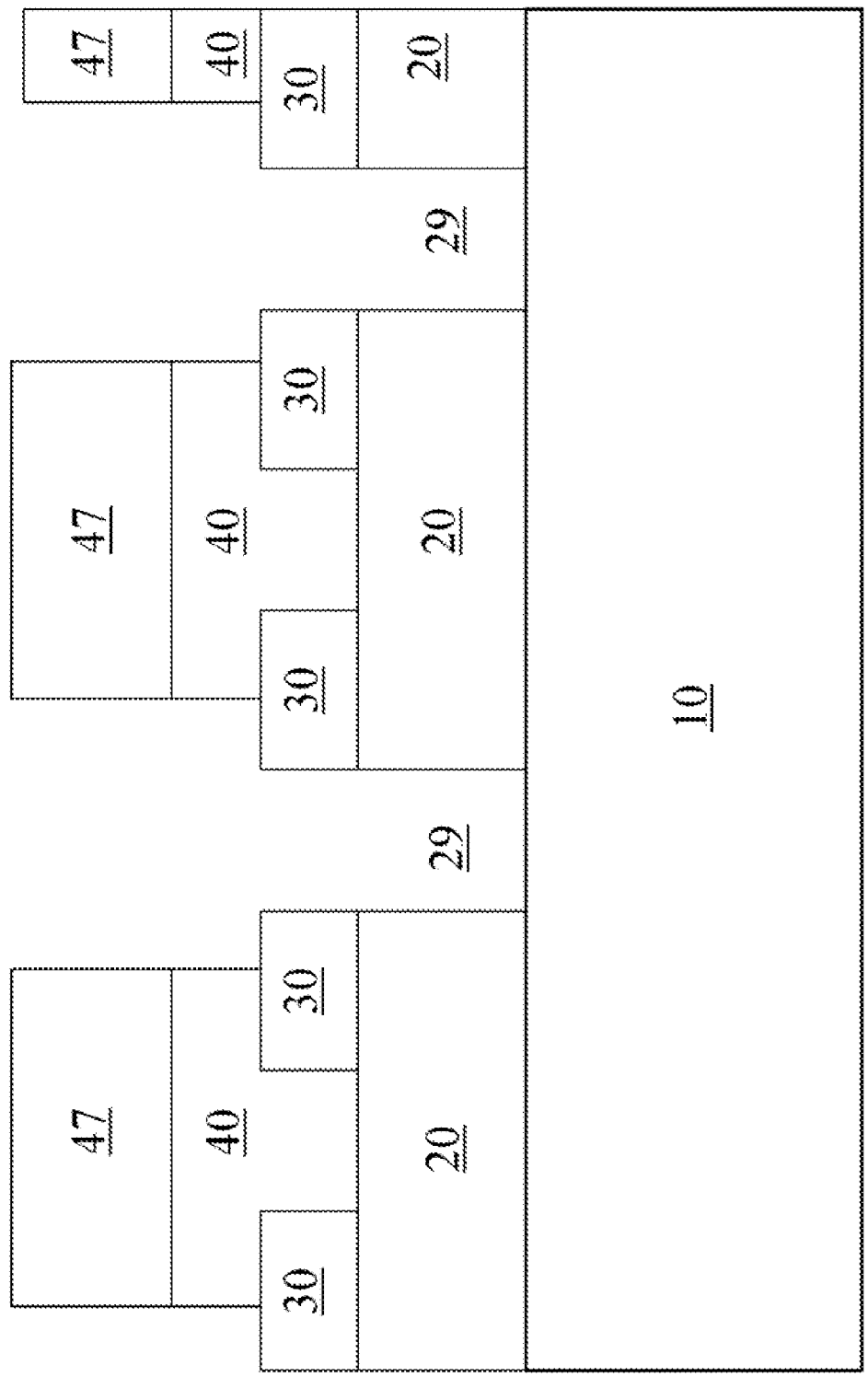

Referring to FIG. 6, a third anisotropic etch is employed to transfer the composite pattern into the underlying layer. The exposed portions of the underlying layer 20 is removed by the third anisotropic etch, which may be an anisotropic reactive ion etch. The third anisotropic etch is selective to the hard mask layer 30, at least one of the second photoresist 47, and the optional planarizing material layer 40. In one case, the remaining portions of the second photoresist 47, which contains the second lithographic pattern, are employed as an etch mask. The second photoresist 47 may be partially or completely consumed during the third anisotropic etch. In another case, the second photoresist 47 may be removed selective to the optional planarizing material layer 40 prior to the third anisotropic etch, and the optional planarizing material layer 30 may be employed as an etch mask. Cavities 29 are formed in the underlying layer 20 directly underneath areas in which the openings in the first lithographic pattern and the openings in the second lithographic pattern overlap.

Figure 7:
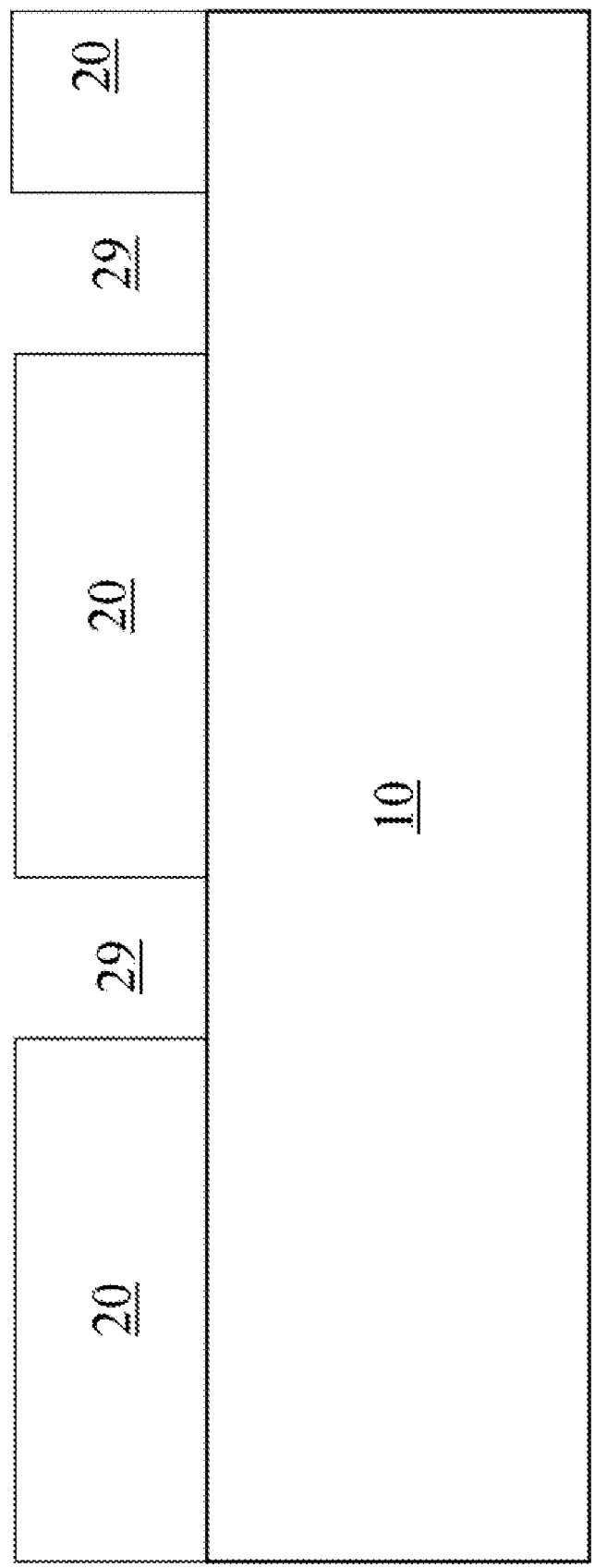

Referring to FIG. 7, any remaining portion of the second photoresist 47 is removed, for example, by ashing. The hard mask layer 30 is also removed selective to the underlying layer 20 and the substrate 10. A wet etch or a dry etch may be employed to remove the hard mask layer 30. Methods of etching and the etch chemistry employed may be optimized to eliminate or reduce any incidental etch of the underlayer 20 and the substrate 10. The underlying layer 20 contains cavities 29, which are formed in areas in which the openings in the first lithographic pattern and the second lithographic pattern. If an area is blocked by any of the first lithographic pattern or the second lithographic pattern, a cavity is not formed in that area.

The instant invention allow high fidelity printing of lithographic images of a composite pattern by decomposing the composite pattern into a first pattern containing periodic and repetitious features and a second pattern containing blocking shape that capture deviations of the composite pattern from the first pattern of the periodic and repetitious features. Thus, each of the cavities 29 in the underlying layer 20 has a regular shape that is free from interference from nearby shapes and optical proximity effects, which would be introduced into printed features if conventional lithography was employed.

Figure 8A:
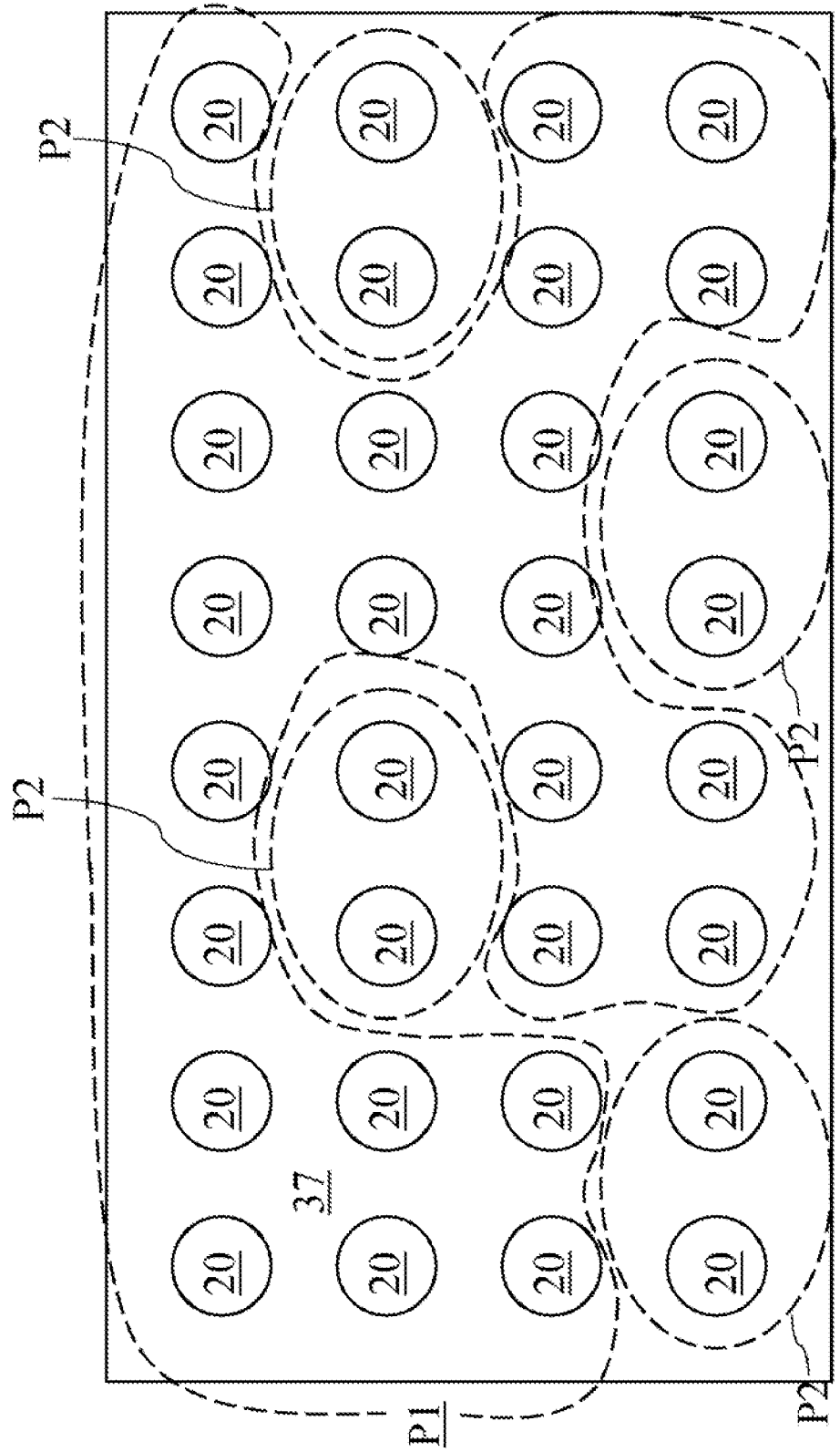
FIGS. 8A-8C are a top-down view of a second exemplary lithographic structure at processing steps corresponding to FIGS. 2, 6, and 7, respectively.

Referring to FIG. 8A, a top-down view of a second exemplary lithographic structure at the step corresponding to FIG. 2 is shown. The second exemplary lithographic structure is formed employing the same methods that are employed to form the first exemplary lithographic structure.

In the second exemplary lithographic structure, the first lithographic pattern is an array of contact holes arranged in a two dimensional array without any defect in the array. The first lithographic pattern comprises a first sub-pattern P1 containing a first array of a contact holes and a second sub-pattern P2 containing a second array of contact holes. The first sub-pattern P1 and the second sub-pattern P2 have the same unit pattern, which is a single contact hole. In other words, the first sub-pattern P1 comprises a first set of contact holes, and the second sub-pattern P2 comprises a second set of content holes. The first set of contact holes and the second set of contact holes are mutually exclusive.

The array of contact holes in the first lithographic pattern allows an optimization of exposure conditions during the patterning of the first photoresist 37. The content holes may, or may not, form a periodic array. In case the contact holes comprise a periodic array, the periodicity of the array structure provides a wider processing window for exposure conditions compared to non-periodic arrays.

Figure 8B:
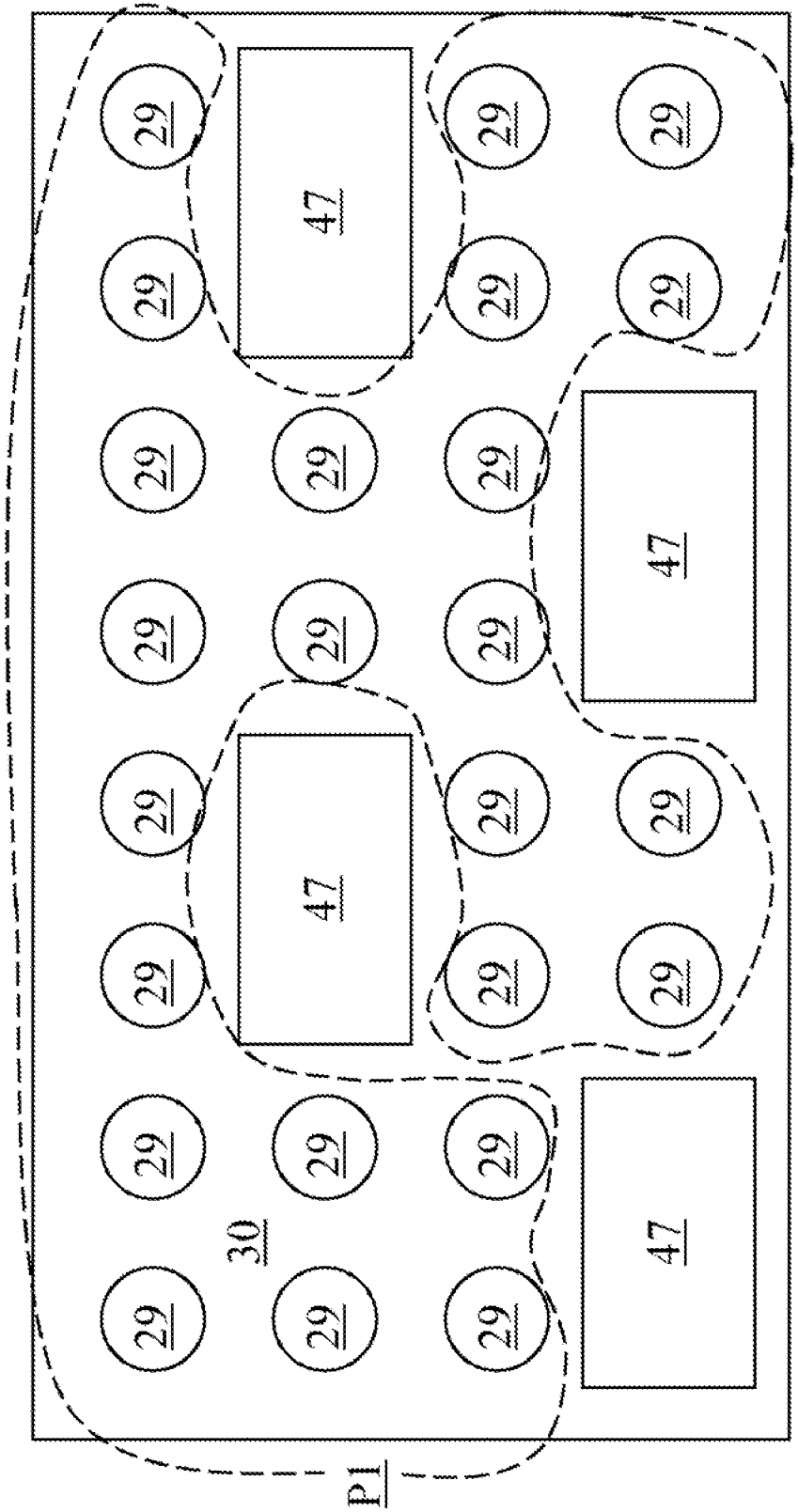

Referring to FIG. 8B, a top-down view of the second exemplary lithographic structure at the step corresponding to FIG. 6 is shown. The second photoresist 47 is patterned in a second lithographic pattern, which comprises at least one blocking shape located over the second sub-pattern P2, which is a subset of the contact holes in the first lithographic pattern. The at least one blocking shape may comprise at least one polygon such as at least one rectangle. The at least one blocking shape covers all contact holes in the second sub-pattern P2, while no contact holes in the first sub-pattern P1 are covered by the second photoresist 47, i.e., all contact holes in the first sub-pattern P1 are exposed at this step. The second lithographic pattern is shown by the shapes of the second photoresist 47. The hard mask layer 30 is shown in the space between each of the cavities 29 and the space between the area of the second photoresist 47 and the cavities 29.

Figure 8C:
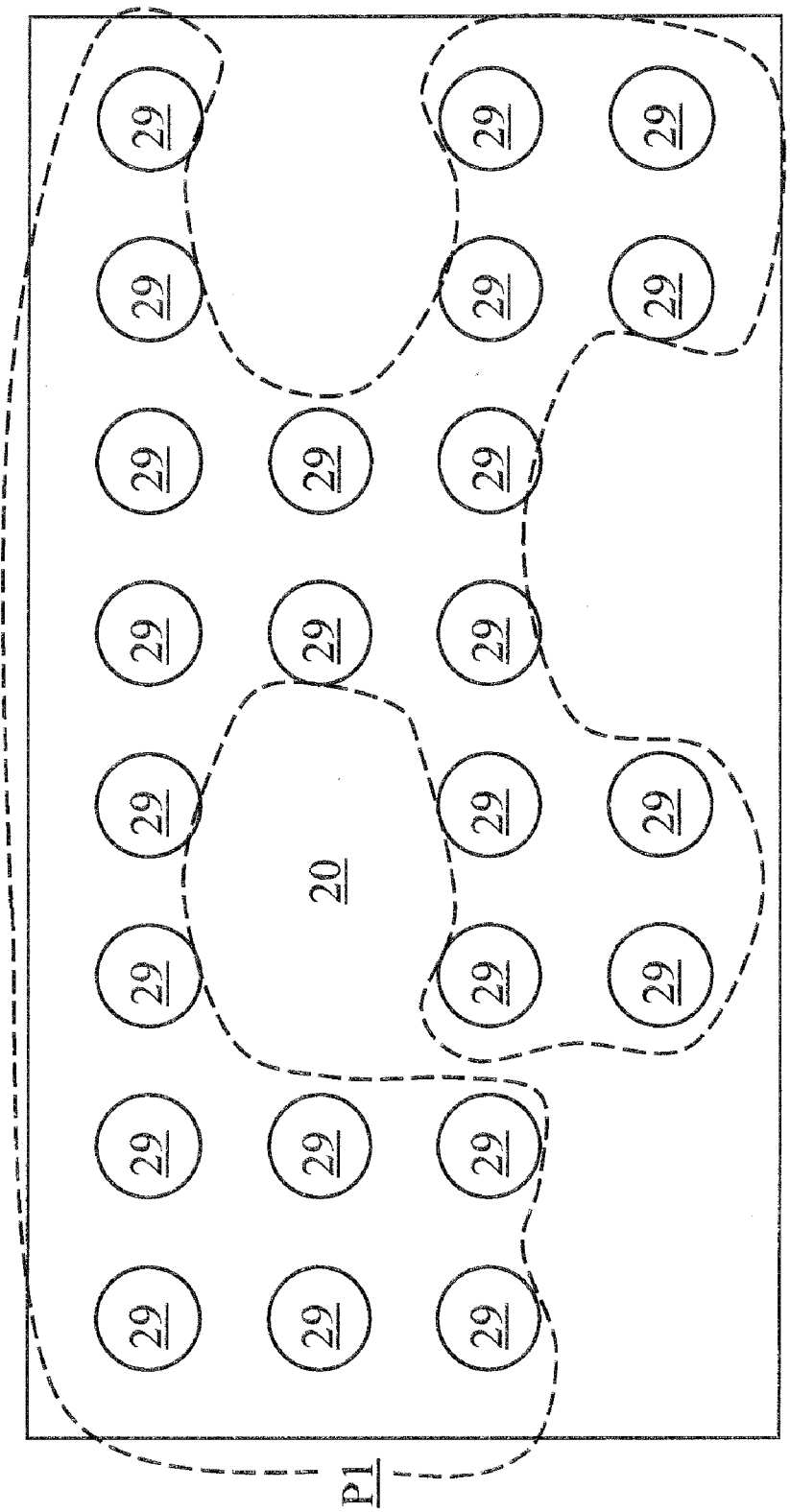

Referring to FIG. 8C, a top-down view of the second exemplary lithographic structure at the step corresponding to FIG. 7 is shown. A composite pattern derived from the first lithographic pattern and the second lithographic pattern is thus formed. The composite pattern is manifested as the collection of the cavities 29 each having a cylindrical shape. The composite pattern includes the first sub-pattern P1 of the first lithographic pattern, but does not include the second sub-pattern P2 of the first lithographic pattern. Any portion of the first lithographic pattern within the area of the second lithographic pattern is excluded in the composite pattern. Since the area of the second lithographic pattern includes all of the second sub-pattern P2, none of the second sub-pattern P2 is present in the composite pattern.

Figure 9A:
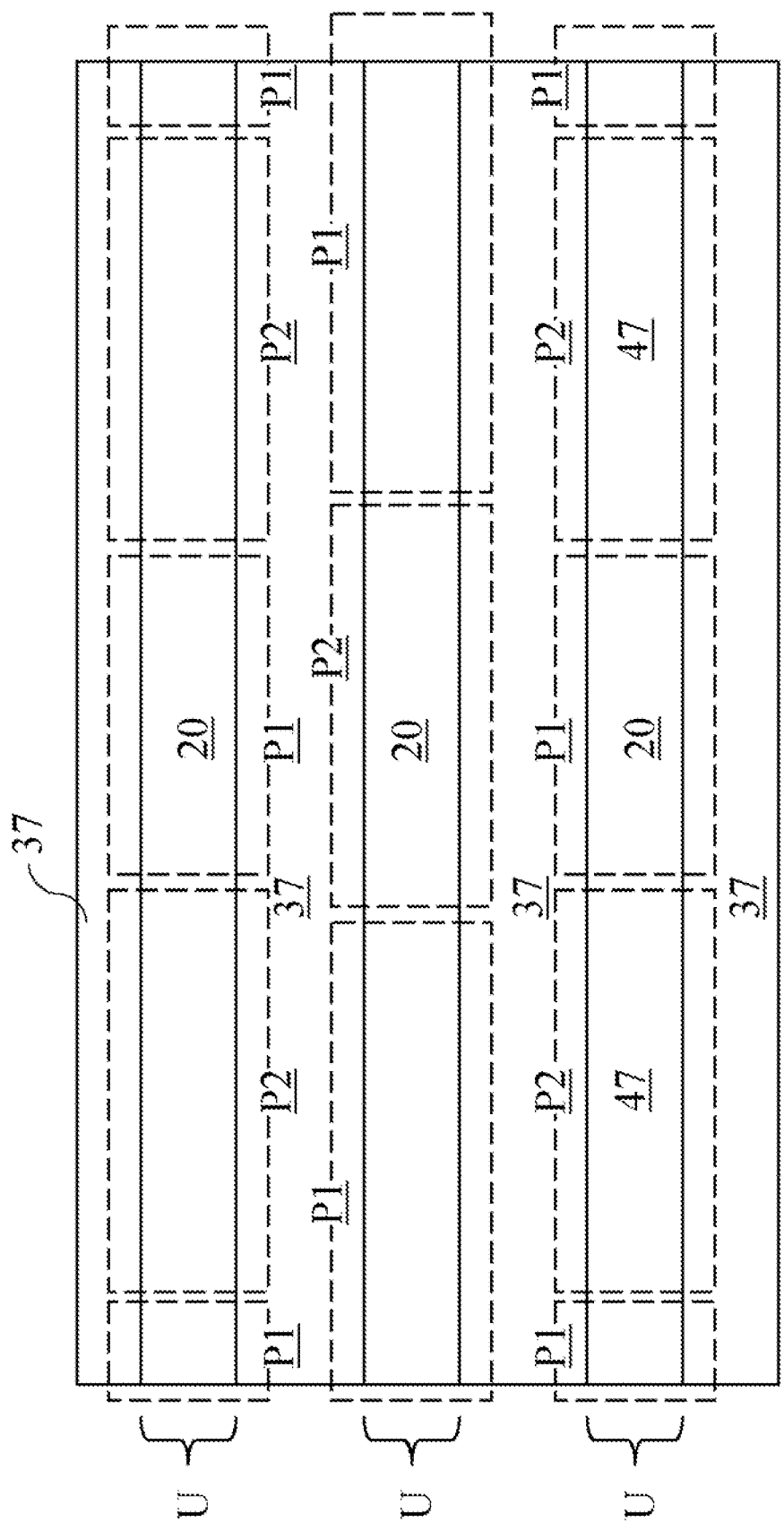
FIGS. 9A-9C are a top-down view of a third exemplary lithographic structure at processing steps corresponding to FIGS. 2, 6, and 7, respectively.
Figure 9B:
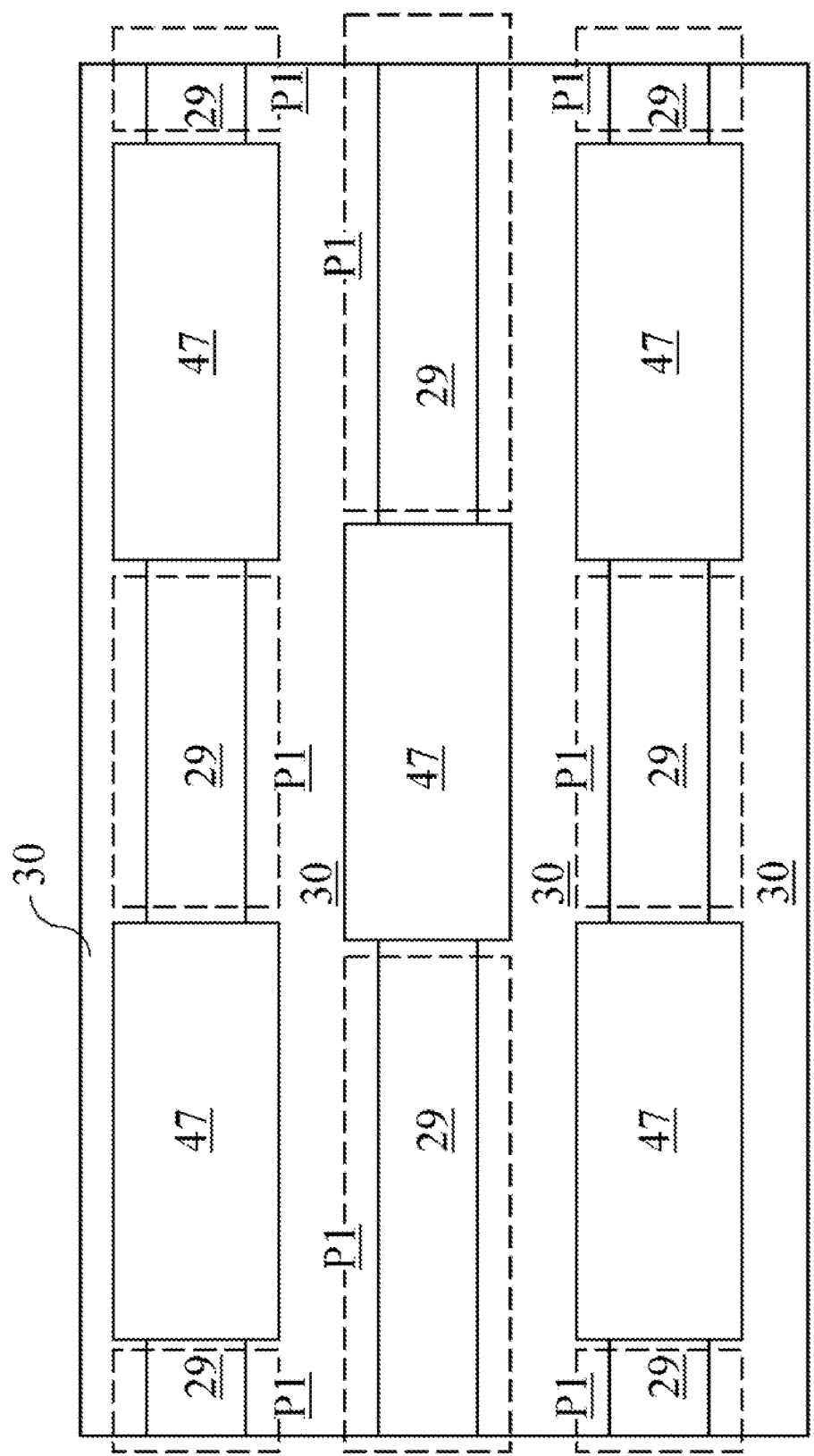

Referring to FIG. 9A, a top-down view of a third exemplary lithographic structure is shown at the step corresponding to FIG. 2 is shown. The second exemplary lithographic structure is formed employing the same methods that are employed to form the first exemplary lithographic structure.

In the third exemplary lithographic structure, the first lithographic pattern comprises a collection of a first sub-pattern P1 and second sub-pattern P2. The first sub-pattern P1 is a first set of trough segments running parallel to one another. The second sub-pattern P2 comprises a second set of trough segments running parallel to one another. The first lithographic pattern comprises an array of a unit pattern U, which is a trough formed by joining at least one trough segment from the first sub-pattern P1 and the second sub-pattern P2. The first lithographic pattern may be a periodic array of the unit pattern U, or may be a non-periodic array of the union pattern U. In case the first lithographic pattern is a periodic array of a trough, the first lithographic pattern is called nested troughs. The width of each of the nested troughs is the same, and the spacing between each pair of the adjacent troughs is the same.

The array of troughs in the first lithographic pattern allows an optimization of exposure conditions during the patterning of the first photoresist 37. The troughs may, or may not, form a periodic array. In case the troughs comprise a periodic array, the periodicity of the array structure provides a wider processing window for exposure conditions compared to non-periodic arrays.

Referring to FIG. 8B, a top-down view of the third exemplary lithographic structure at the step corresponding to FIG. 6 is shown. The second photoresist 47 is patterned in a second lithographic pattern, which comprises at least one blocking shape located over the second sub-pattern P2, which is a subset of the area defined by the first lithographic pattern and comprises disjoined trough segments. The at least one blocking shape may comprise at least one polygon such as at least one rectangle. The at least one blocking shape covers all trough segments in the second sub-pattern P2, while no trough segments in the first sub-pattern P1 are covered by the second photoresist 47, i.e., all trough segments in the first sub-pattern P1 are exposed at this step. The second lithographic pattern is shown by the shapes of the second photoresist 47. The hard mask layer 30 is shown in the space between the areas occupied by the cavities 29 and the second photoresist 47.

Figure 9C:
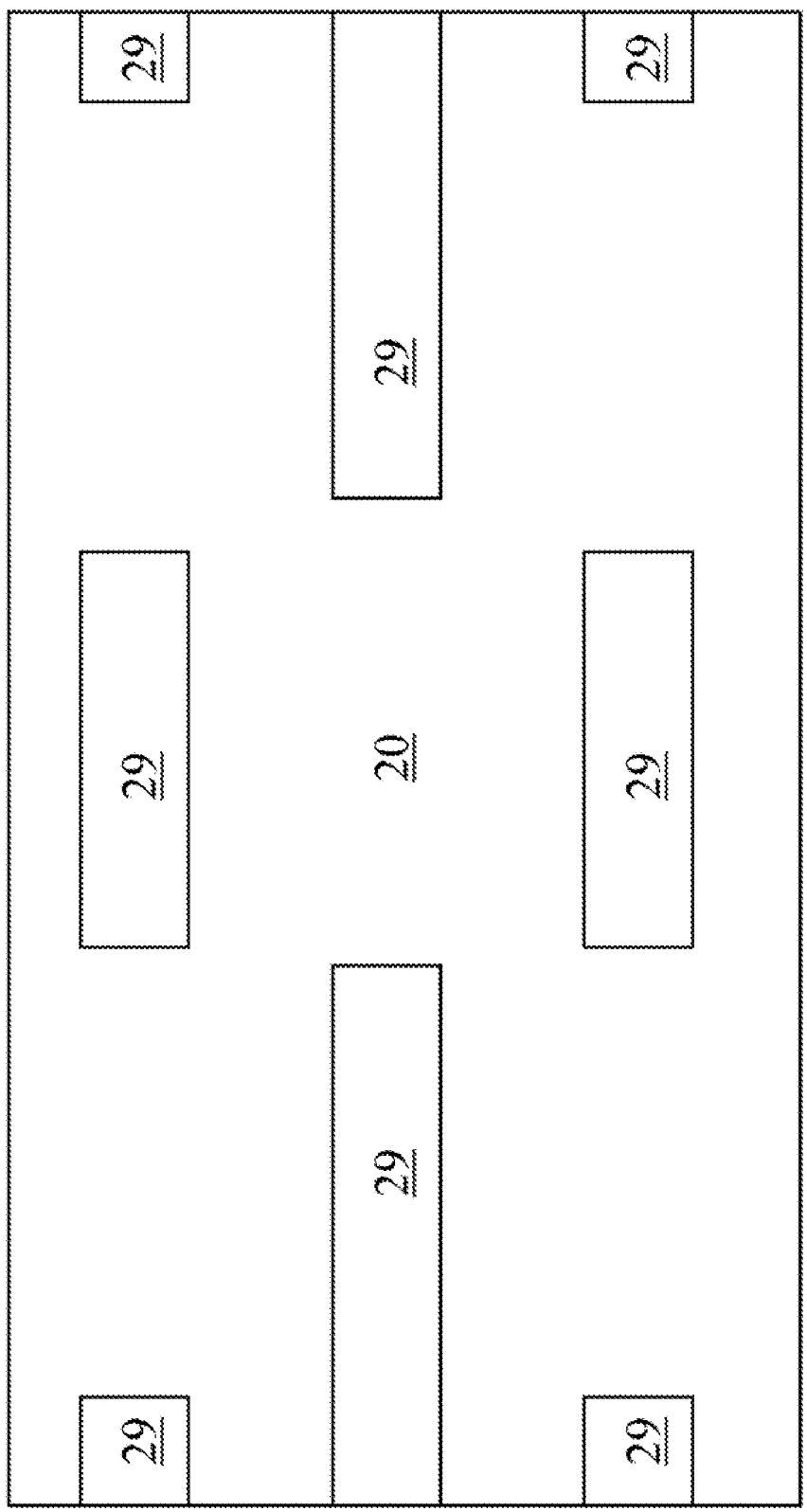

Referring to FIG. 9C, a top-down view of the third exemplary lithographic structure at the step corresponding to FIG. 7 is shown. A composite pattern derived from the first lithographic pattern and the second lithographic pattern is thus formed. The composite pattern is manifested as the collection of the cavities 29 each having a rectangular shape, which are trough segments. The composite pattern includes the first sub-pattern P1 of the first lithographic pattern, but does not include the second sub-pattern P2 of the first lithographic pattern. Any portion of the first lithographic pattern within the area of the second lithographic pattern is excluded in the composite pattern. Since the area of the second lithographic pattern includes all of the second sub-pattern P2, none of the second sub-pattern P2 is present in the composite pattern.

Figure 10A:
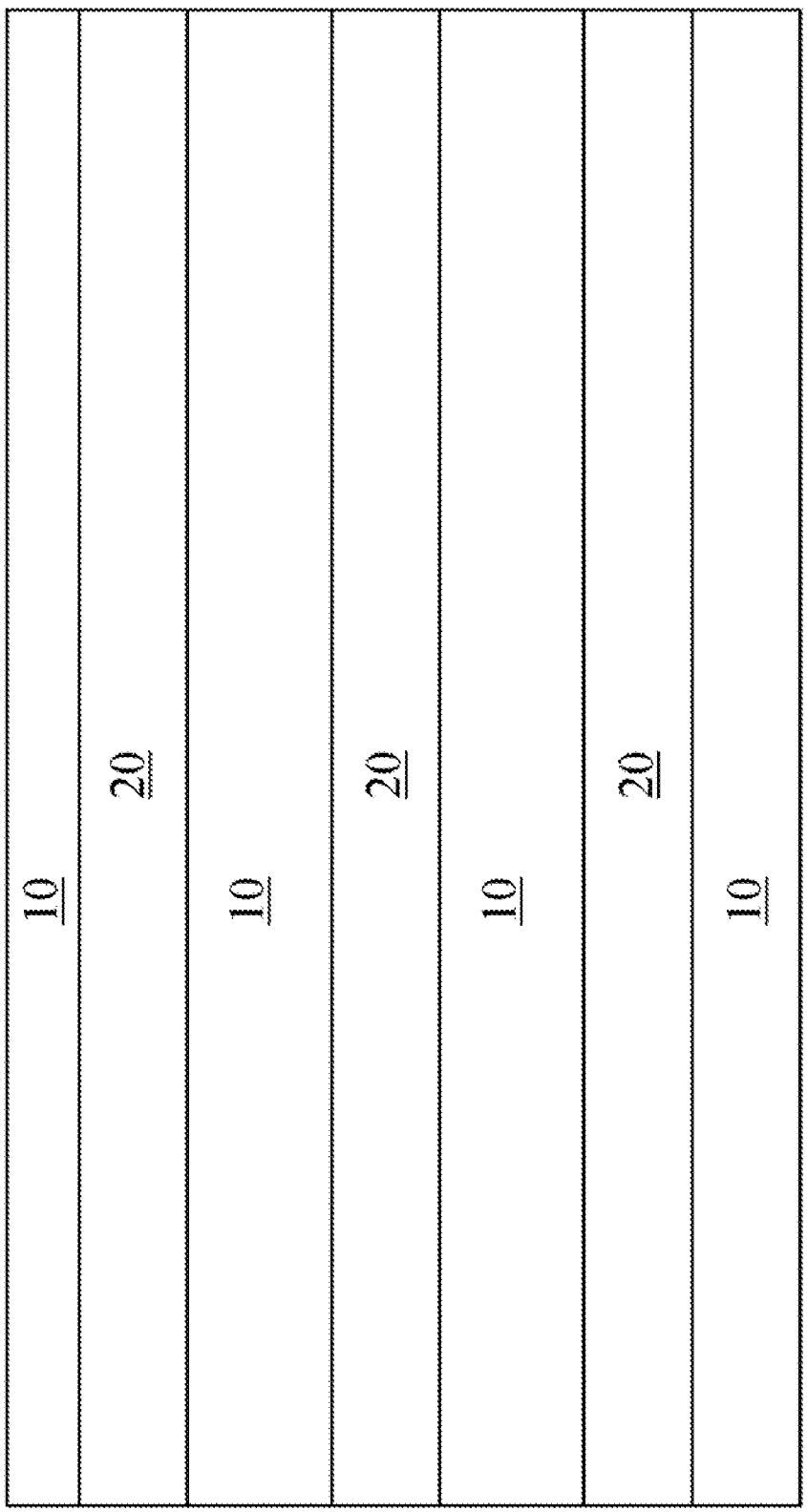
FIGS. 10A-10D are sequential top-down views of a fourth exemplary lithographic structure according to the present invention.

Referring to FIG. 10A, a top down view of a fourth exemplary lithographic structure is shown, which comprises an underlying layer 20 having a predefined pattern in the shape of a set of nested lines. The substrate 10 is shown between each of the nested lines formed by the underlying layer 20.

Figure 10B:
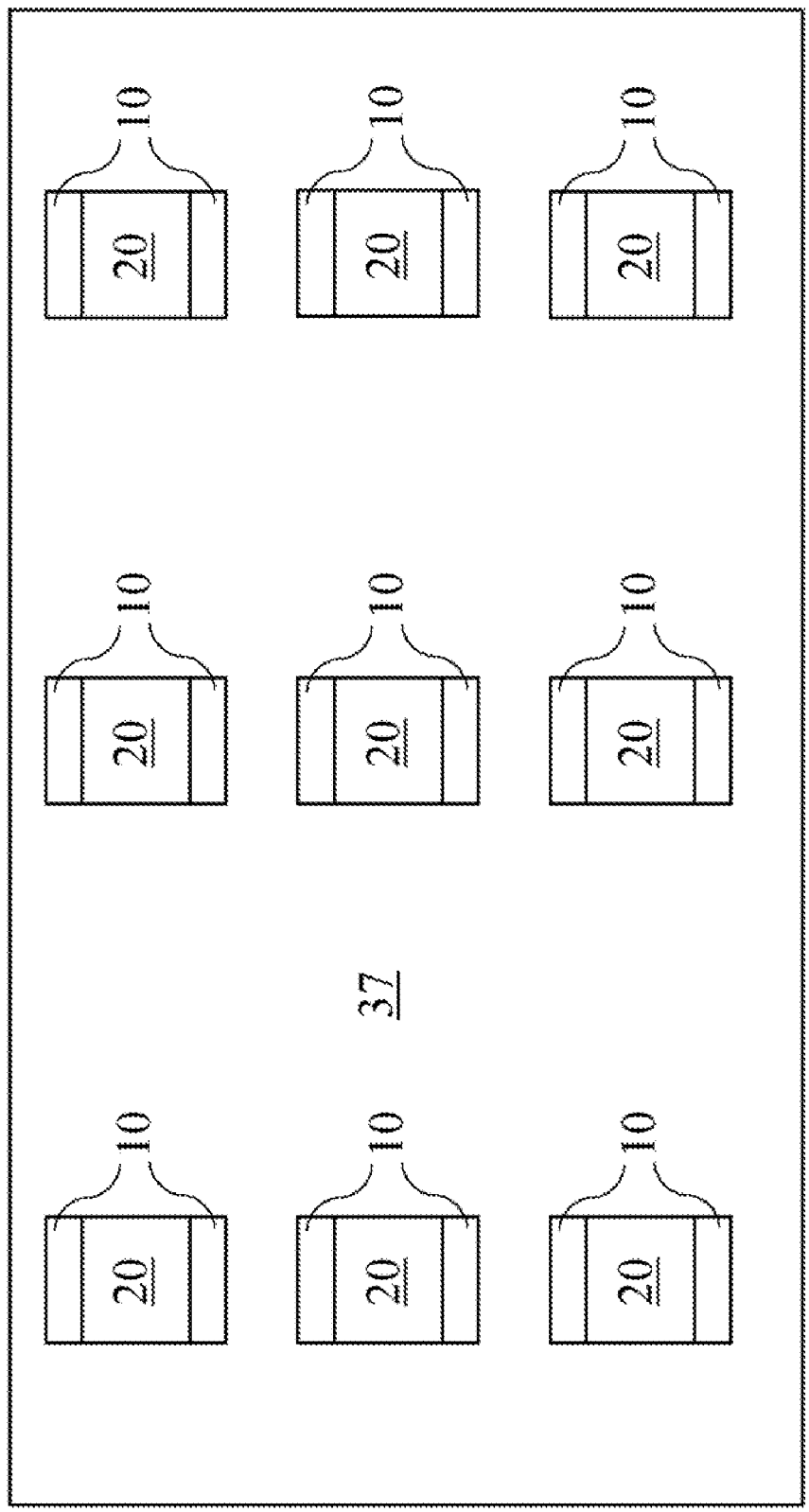

Referring to FIG. 10B, a hard mask layer 30 and a first photoresist 37 is applied to the fourth exemplary lithographic structure. The first photoresist 37 is patterned with a first lithographic pattern, which is subsequently transferred to the hard mask layer 30 employing the same processing steps corresponding to FIGS. 1 and 2. In this case, the first lithographic pattern contains an array of openings, each having the same shape. The shape may be polygonal, circular, or elliptical. Portions of the underlying layer 20 and portions of the substrate 10 may be exposed in the array of openings formed in the first photoresist 37 and the hard mask layer 30.

Figure 10C:
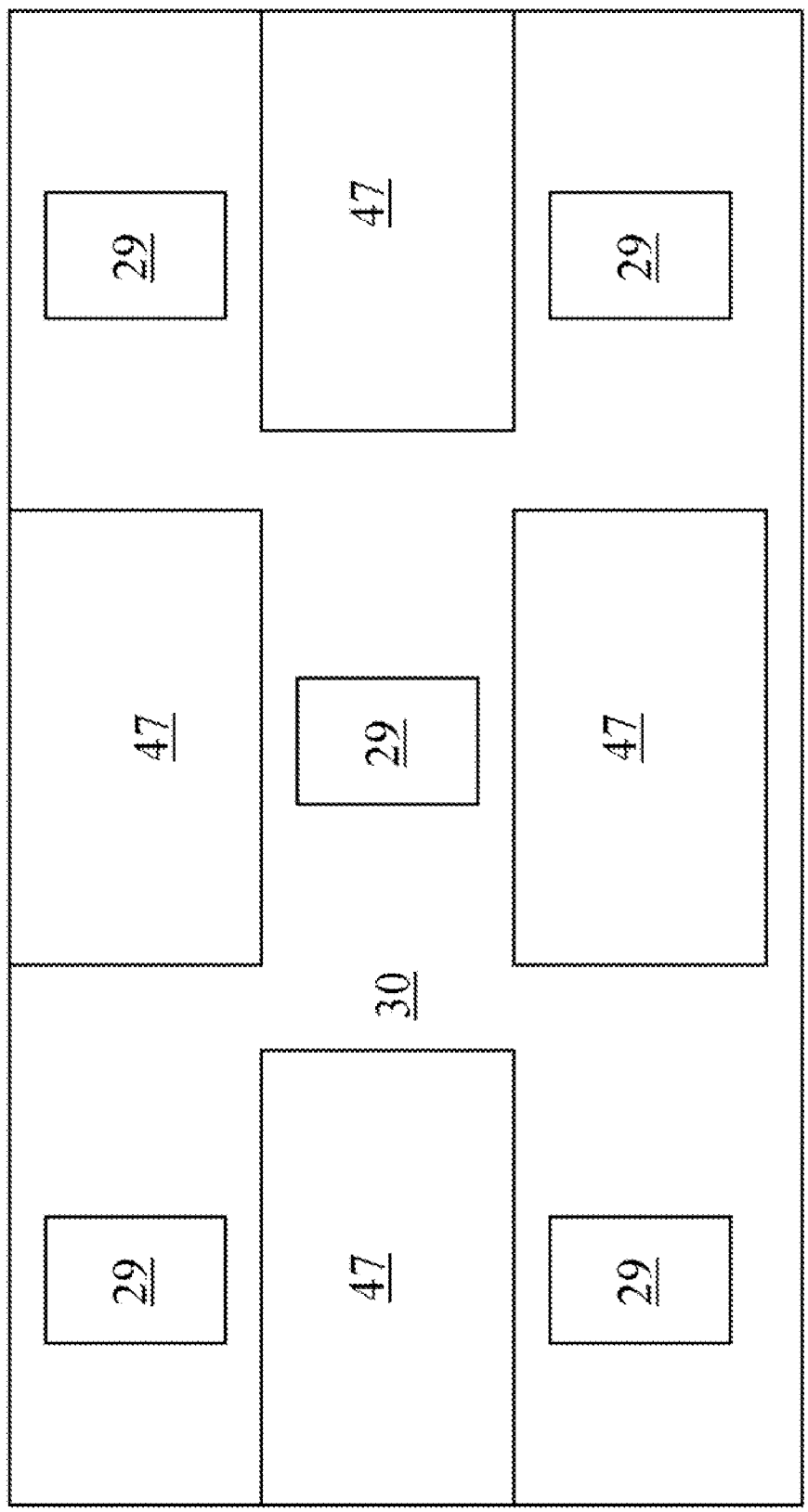

Referring to FIG. 10C, processing steps corresponding to FIGS. 3-6 are performed on the fourth exemplary lithographic structure. The second lithographic pattern comprises at least one blocking shape located over portions of the array of openings in the first lithographic pattern. The at least one blocking shape may comprise at least one polygon such as at least one rectangle.

A composite pattern including the first lithographic pattern and the second lithographic pattern is thus formed, in which the composite pattern is manifested as the collection of the cavities 29 each having a rectangular shape. The second lithographic pattern is shown by the shapes of the second photoresist 47. The hard mask layer 30 is shown in the space among each of the cavities 29, beneath each of which a portion of the substrate 10 is exposed, and each of the portions of the second photoresist 47.

Figure 10D:
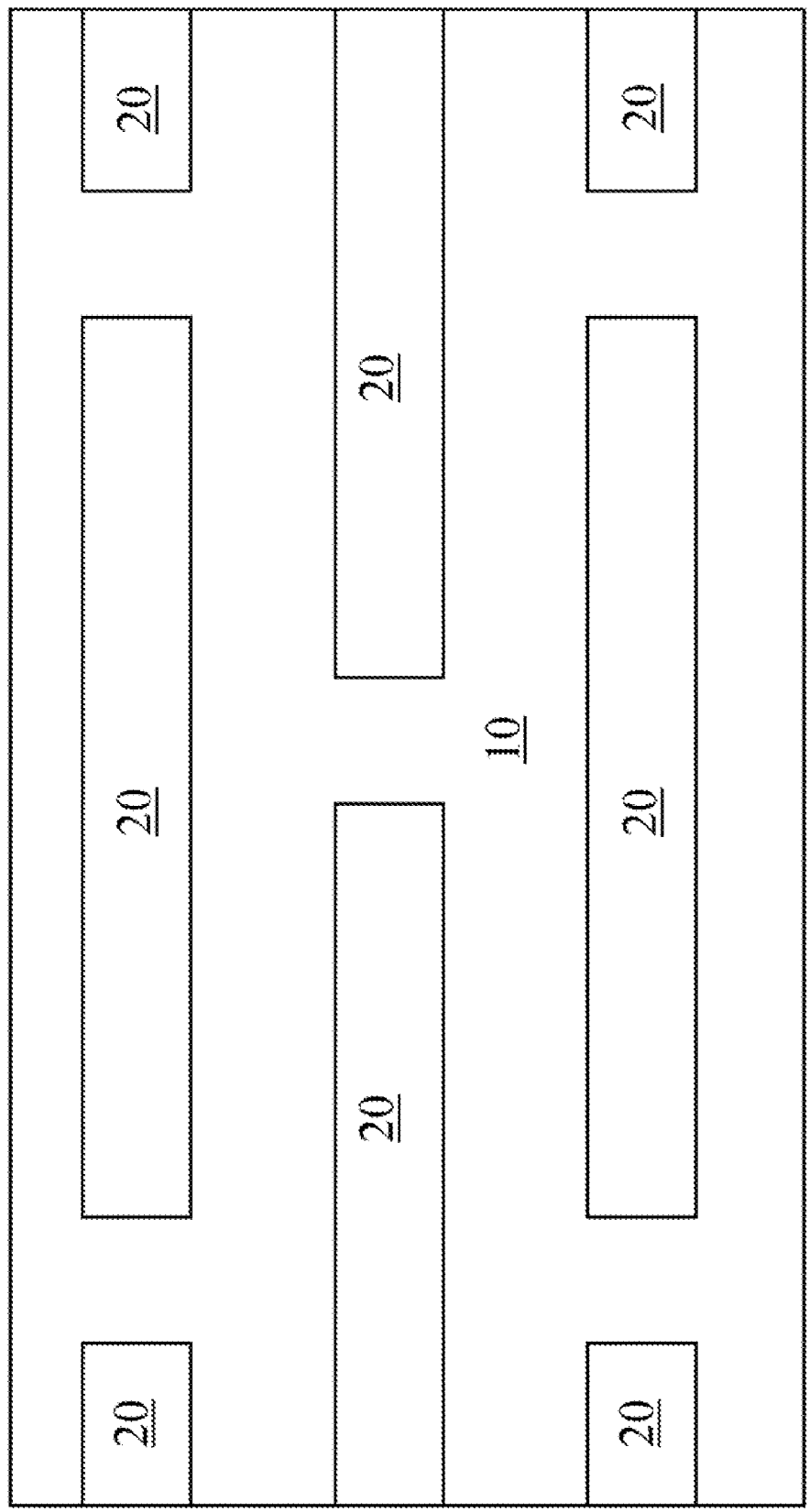

Referring to FIG. 10D, the second photoresist 47 and the hard mask layer 30 are removed selective to the underlying layer 20 and the substrate 10. The predefined pattern of the underlying layer 20, which consists of the set of nested lines, is modified by the removal of the portions of the underlying layer 20 coinciding with the cavities 29 formed in the composite pattern. Thus, the underlying layer 20 has a pattern of broken lines. Compared with prior art processing schemes in which the shape of each line is defined in one lithographic step and optical proximity effects such as line edge shortening (LES) plays a role, the methods of the present invention enables formation of features with a preset line edge by employing a composite pattern of the two lithographic patterns.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A method of forming a lithographic pattern comprising:
   forming an underlayer on a substrate;
   forming a hard mask layer having a bottom surface in physical contact with a surface of said underlayer;
   applying a first photoresist and lithographically patterning said first photoresist with a first pattern including a first sub-pattern and a second sub-pattern, wherein said first sub-pattern said second sub-pattern contain at least one instance of a unit pattern;
   transferring said first pattern into said hard mask layer, wherein a first set of openings replicating said first sub-pattern and a second set of openings replicating said second sub-pattern are formed within said hard mask layer;

applying a second photoresist on said hard mask layer and said underlayer, wherein a material layer selected from said second photoresist and an planarizing material layer fills each of said first set of openings and each of said second set of openings;

lithographically patterning said material layer with a second pattern, wherein said second set of openings in said hard mask layer is filled with said material layer while said surface of said underlayer is physically exposed within said first set of openings in said hard mask layer; and transferring a composite pattern of said first pattern and said second pattern into said underlayer, wherein said composite pattern includes openings within said underlayer that underlie said first set of openings in said hard mask layer and does not include any opening underneath said second set of openings in said hard mask layer.

2. The method of claim 1, wherein printability of said first pattern is greater than printability of said first sub-pattern.

3. The method of claim 1, wherein said first pattern comprises at least one two-dimensional array of said unit pattern.

4. The method of claim 3, wherein said at least one two-dimensional array is a periodic two dimensional array.

5. The method of claim 3, wherein said unit pattern is a contact hole.

6. The method of claim 1, wherein said hard mask layer comprises a material selected from a dielectric oxide, a dielectric nitride, a dielectric oxynitride, and amorphous carbon, hydrogenated amorphous carbon, near frictionless carbon (NFC), a combination thereof, and a tunable etch resistant anti-reflective-coating (TERA) material.

7. The method of claim 1, further comprising performing a first anisotropic etch to transfer said first pattern into said hard mask layer, and wherein said first anisotropic etch is selective to said underlayer.

8. The method of claim 7, further comprising performing a second anisotropic etch to transfer said composite pattern into said underlayer, wherein said second anisotropic etch is selective to said hard mask layer.

9. A method of forming a lithographic pattern comprising:
forming an underlayer on a substrate;
forming a hard mask layer having a bottom surface in physical contact with a surface of said underlayer;
applying a first photoresist and lithographically patterning said first photoresist with a first pattern including a first sub-pattern and a second sub-pattern, wherein said first sub-pattern said second sub-pattern contain at least one instance of a unit pattern;
transferring said first pattern into said hard mask layer, wherein a first set of openings replicating said first sub-pattern and a second set of openings replicating said second sub-pattern are formed within said hard mask layer;
applying a second photoresist on said hard mask layer and said underlayer, wherein a material layer selected from said second photoresist and an planarizing material layer fills each of said first set of openings and each of said second set of openings;
lithographically patterning said material layer with a second pattern, wherein said second set of openings in said hard mask layer is filled with said material layer while said surface of said underlayer is physically exposed within said first set of openings in said hard mask layer; and
transferring a composite pattern of said first pattern and said second pattern into said underlayer, wherein said composite pattern includes openings within said underlayer that underlie said first set of openings in said hard mask layer and does not include any opening underneath said second set of openings in said hard mask layer.

10. The method of claim 9, wherein printability of said first pattern is inherently greater than printability of said first sub-pattern.

11. The method of claim 9, wherein each of said first sub-pattern comprises a first trough segment and said second sub-pattern comprises a second trough segment, wherein said second trough segment abuts said first trough segment, and wherein said unit pattern is a trough comprising said first trough segment and said second trough segment.

12. The method of claim 9, wherein said first pattern comprises a one dimensional array of said trough.

13. The method of claim 12, wherein said first pattern comprises a set of nested troughs and said unit pattern is one of said nested troughs.

14. The method of claim 9, further comprising patterning said underlayer prior to said forming of said hard mask layer.

15. The method of claim 9, wherein said hard mask layer comprises a material selected from a dielectric oxide, a dielectric nitride, a dielectric oxynitride, and amorphous carbon, hydrogenated amorphous carbon, near frictionless carbon (NFC), a combination thereof, and a tunable etch resistant anti-reflective-coating (TERA) material.

16. The method of claim 9, further comprising performing a first anisotropic etch to transfer said first pattern into said hard mask layer, and wherein said first anisotropic etch is selective to said underlayer.

17. The method of claim 16, further comprising performing a second anisotropic etch to transfer said composite pattern into said underlayer, wherein said second anisotropic etch is selective to said hard mask layer.

18. A method of forming a lithographic pattern comprising:
forming an underlayer on a substrate;
forming a hard mask layer comprising an inorganic material and having a bottom surface in physical contact with a surface of said underlayer;
applying a first photoresist and lithographically patterning said first photoresist with a first pattern including an array of a unit pattern, wherein exposure conditions are optimized for presence of said array of said unit pattern;
transferring said first pattern into said hard mask layer, wherein a first set of openings replicating said first sub-pattern and a second set of openings replicating said second sub-pattern are formed within said hard mask layer;
applying a second photoresist on said hard mask layer and said underlayer, wherein a material layer selected from said second photoresist and an planarizing material layer fills each of said first set of openings and each of said second set of openings;
lithographically patterning said material layer with a second pattern, wherein said second set of openings in said hard mask layer is filled with said material layer while said surface of said underlayer is physically exposed within said first set of openings in said hard mask layer; and
transferring a composite pattern of said first pattern and said second pattern into said underlayer, wherein said composite pattern includes openings within said underlayer that underlie said first set of openings in said hard mask layer and does not include any opening underneath said second set of openings in said hard mask layer.

19. The method of claim 18, wherein said hard mask layer comprises one of a dielectric oxide, a dielectric nitride, a dielectric oxynitride, a tunable etch resistant anti-reflective-coating (TERA) material, amorphous carbon, hydrogenated amorphous carbon, near frictionless carbon (NFC), and a combination thereof.

20. The method of claim 18, further comprising applying a planarizing material layer directly on said hard mask layer, wherein said second photoresist is applied on said BARC layer, and said composite pattern is not present in said substrate after said composite pattern is transferred into said underlayer.

* * * * *